(12) United States Patent
Huang et al.

(10) Patent No.: US 10,422,831 B2
(45) Date of Patent: Sep. 24, 2019

(54) CHIP-TO-CHIP SIGNAL TRANSMISSION SYSTEM AND SIGNAL RECEPTION CIRCUIT

(71) Applicant: I-SHOU UNIVERSITY, Kaohsiung (TW)

(72) Inventors: Yu-Jung Huang, Kaohsiung (TW); Yan-Cen Liou, Kaohsiung (TW)

(73) Assignee: I-SHOU UNIVERSITY, Kaohsiung (TW)

( * ) Notice: Subject to any disclaimer, the term of this patent is extended or adjusted under 35 U.S.C. 154(b) by 203 days.

(21) Appl. No.: 15/451,429

(22) Filed: Mar. 7, 2017

(65) Prior Publication Data

US 2018/0198538 A1 Jul. 12, 2018

(30) Foreign Application Priority Data

Jan. 11, 2017 (TW) .............................. 106100794 A (51) Int. Cl.
*G01R 31/28* (2006.01)
*H04B 5/00* (2006.01)

(52) U.S. Cl.
CPC ....... *G01R 31/2884* (2013.01); *H04B 5/0012* (2013.01)

(58) Field of Classification Search
CPC ... H04B 17/14; H04B 5/0012; G01R 31/2884
See application file for complete search history.

(56) References Cited

U.S. PATENT DOCUMENTS 8,669,656 B2 3/2014 Slupsky et al.
9,274,167 B2 3/2016 Huang et al.
(Continued)

FOREIGN PATENT DOCUMENTS

TW 201218354 5/2012
TW 201503614 1/2015

OTHER PUBLICATIONS

"Office Action of Taiwan Counterpart Application", dated Mar. 31, 2018, p. 1-p. 3, in which the listed references were cited.

*Primary Examiner* — Akm Zakaria
(74) *Attorney, Agent, or Firm* — JCIPRNET (57) ABSTRACT

The present invention provides a chip-to-chip signal transmission system. Signal transmission is performed between a transmitter of a first chip and a receiver of a second chip through a transmission-metal-pad and a reception-metal-pad. When receiving a driving-testing signal, the transmitter transmits a transmission-testing-coupling signal through the transmission-metal-pad according to the driving-testing signal. A receiving-testing circuit on the first chip receives the transmission-testing-coupling signal through the transmission-testing-metal-pad, and outputs a transmission-testing signal according to the transmission-testing-coupling signal. When receiving the driving-testing signal, a driving-testing circuit on the second chip transmits a receiving-testing-coupling signal through a reception-testing-metal-pad according to the driving-testing signal. The receiver receives the receiving-testing-coupling signal through the reception-metal-pad and outputs a receiving-testing signal according to the receiving-testing-coupling signal.

6 Claims, 3 Drawing Sheets

(56) References Cited

U.S. PATENT DOCUMENTS

| | | | |
|---|---|---|---|
| 2005/0040839 A1* | 2/2005 | Neaves | G01R 31/312 |
| | | | 324/750.3 |
| 2006/0171477 A1* | 8/2006 | Carballo | H04L 25/0272 |
| | | | 375/257 |
| 2006/0290377 A1 | 12/2006 | Kim et al. | |
| 2013/0021048 A1* | 1/2013 | Peng | G01R 31/2822 |
| | | | 324/750.3 |
| 2014/0016949 A1* | 1/2014 | Koizumi | H04B 10/69 |
| | | | 398/212 |

* cited by examiner

CHIP-TO-CHIP SIGNAL TRANSMISSION SYSTEM AND SIGNAL RECEPTION CIRCUIT

CROSS-REFERENCE TO RELATED APPLICATION

This application claims the priority benefit of Taiwan application serial no. 106100794, filed on Jan. 11, 2017. The entirety of the above-mentioned patent application is hereby incorporated by reference herein and made a part of this specification.

BACKGROUND OF THE INVENTION

1. Field of the Invention

The present invention generally relates to an electronic circuit, in particular, to a chip-to-chip signal transmission system and signal reception circuit.

2. Description of Related Art

Capacitive coupling interconnection is a chip-to-chip wireless connection technology. The technology transmits a signal from one chip to another chip by using capacitive coupling. The capacitive coupling interconnection is mainly performed through AC coupled interconnection (AC coupled interconnect, ACCI), and can complete signal transmission in a high-frequency transmission case only with good AC association rather than a connection of a DC electrical component.

Chip-to-chip signal transmission does not need to be performed through a physical route, and a signal is transmitted by using characteristics that an AC can pass through a capacitor (that is, a higher frequency indicates a lower impedance), and theoretically, transmission should be performed more easily, but actually, the signal may be weakened after passing through the capacitor. As a result, a signal transmitted by a transmitter needs to be recover by using an amplifier in a receiver. Therefore, at present, a designer generally studies a circuit structure intensively, to expect that a signal is not easily interfered by effects of some interference factors during chip-to-chip transmission. However, changes may merely be performed during a circuit design. Because a so-called process technology exists at the end of a production line, after a chip is physically made at the end of the production line, it is represented that for a same circuit, each chip may have different circuit states due to process differences, and the chip cannot be adjusted after being physically made, resulting in that a yield of a finished product is affected.

On the other hand, a general AC capacitive coupling chip-to-chip interconnection technology is merely applied to a group of paired chips. That is, can signal transmission between a transmitter circuit and a receiver circuit be measured only after two chips of the transmitter circuit and the receiver circuit are actually assembled. For example, a testing signal may be inputted into the transmitter circuit to merely measure whether the transmitter circuit normally runs, but it is cannot be detected whether a coupling effect between the transmitter circuit and the receiver circuit is good. Similarly, although the testing signal can be inputted from a metal pad (Metal Pad) from the receiver circuit to detect whether the receiver circuit normally runs, it is cannot be detected whether the coupling effect between the transmitter circuit and the receiver circuit is too.

SUMMARY OF THE INVENTION

In view of this, the present invention provides a chip-to-chip signal transmission system and signal reception circuit, so as to effectively reduce a failure rate of a chip through signal optimization, and implement self-testing of a single chip.

The present invention provides a chip-to-chip signal transmission system, and the chip-to-chip signal transmission system includes a first chip and a second chip, where the second chip is disposed above the first chip. The first chip includes a transmission-metal-pad, a transmitter, and a first testing block. The transmission-metal-pad is disposed on a surface of the first chip. The transmitter is coupled with the transmission-metal-pad, and is used for: receiving an input signal, and outputting a chip-to-chip coupling signal through the transmission-metal-pad. The first testing block includes a transmission-testing-metal-pad and a receiving-testing circuit, where the transmission-testing-metal-pad is coupled with the transmission-metal-pad. The second chip includes a reception-metal-pad, a receiver, and a second testing block. The receiver is coupled with the reception-metal-pad, receives the chip-to-chip coupling signal through the reception-metal-pad, and outputs an output signal, where the receiver receives a first control voltage outputted by a control circuit to adjust the output signal. The second testing block includes a reception-testing-metal-pad and a driving-testing circuit, where the reception-testing-metal-pad is coupled with the reception-metal-pad. When receiving a driving-testing signal, the transmitter transmits a transmission-testing-coupling signal through the transmission-metal-pad according to the driving-testing signal, the receiving-testing circuit receives the transmission-testing-coupling signal through the transmission-testing-metal-pad, and the receiving-testing circuit outputs a transmission-testing signal according to the transmission-testing-coupling signal, where the receiving-testing circuit receives a second control voltage outputted by the control circuit to adjust the transmission-testing signal. When receiving the driving-testing signal, the driving-testing circuit transmits a receiving-testing-coupling signal through the reception-testing-metal-pad according to the driving-testing signal, the receiver receives the receiving-testing-coupling signal through the reception-metal-pad, and the receiver outputs a receiving-testing signal according to the receiving-testing-coupling signal, where the receiver receives a third control voltage outputted by the control circuit to adjust the receiving-testing signal.

In addition, the present invention provides a signal reception circuit, and the signal reception circuit is disposed on a chip. The signal reception circuit includes a reception-metal-pad and a receiver. The reception-metal-pad is disposed on a surface of the chip. The receiver is coupled with the reception-metal-pad, receives an input signal through the reception-metal-pad, and outputs a recovery signal. The receiver includes an amplification circuit, a latch circuit, and a receiving buffer circuit. The amplification circuit is used for: receiving the input signal, and generating an amplified input signal, where the amplification circuit adjusts an amplification rate of the amplified input signal by receiving a control voltage outputted by a control circuit. The latch circuit is coupled with the amplification circuit, and is used for: latching the amplified input signal, and outputting a pre-recovery signal. The receiving buffer circuit is coupled with the latch circuit, and is used for: receiving the pre-recovery signal, and outputting the recovery signal.

Based on the foregoing, the present invention provides a chip-to-chip signal transmission system and signal receiving circuit. By means of the chip-to-chip signal transmission system, a receiving-testing circuit and a driving-testing circuit that are simple and same are disposed in paired transmitter and receiver, so that when signal transmission between chips fails, possible defective factors can be selected through self-testing of the chips. In addition, by means of the chip-to-chip signal transmission system of the present invention, a chip in a relatively poor process environment may be adjusted to an available range by adjusting a conductive voltage of an amplification circuit at a receiving end, thereby further reducing a failure rate of the chip effectively.

In order to make the aforementioned and other objectives and advantages of the present invention comprehensible, embodiments accompanied with figures are described in detail below.

DESCRIPTION OF THE EMBODIMENTS

Figure 1:
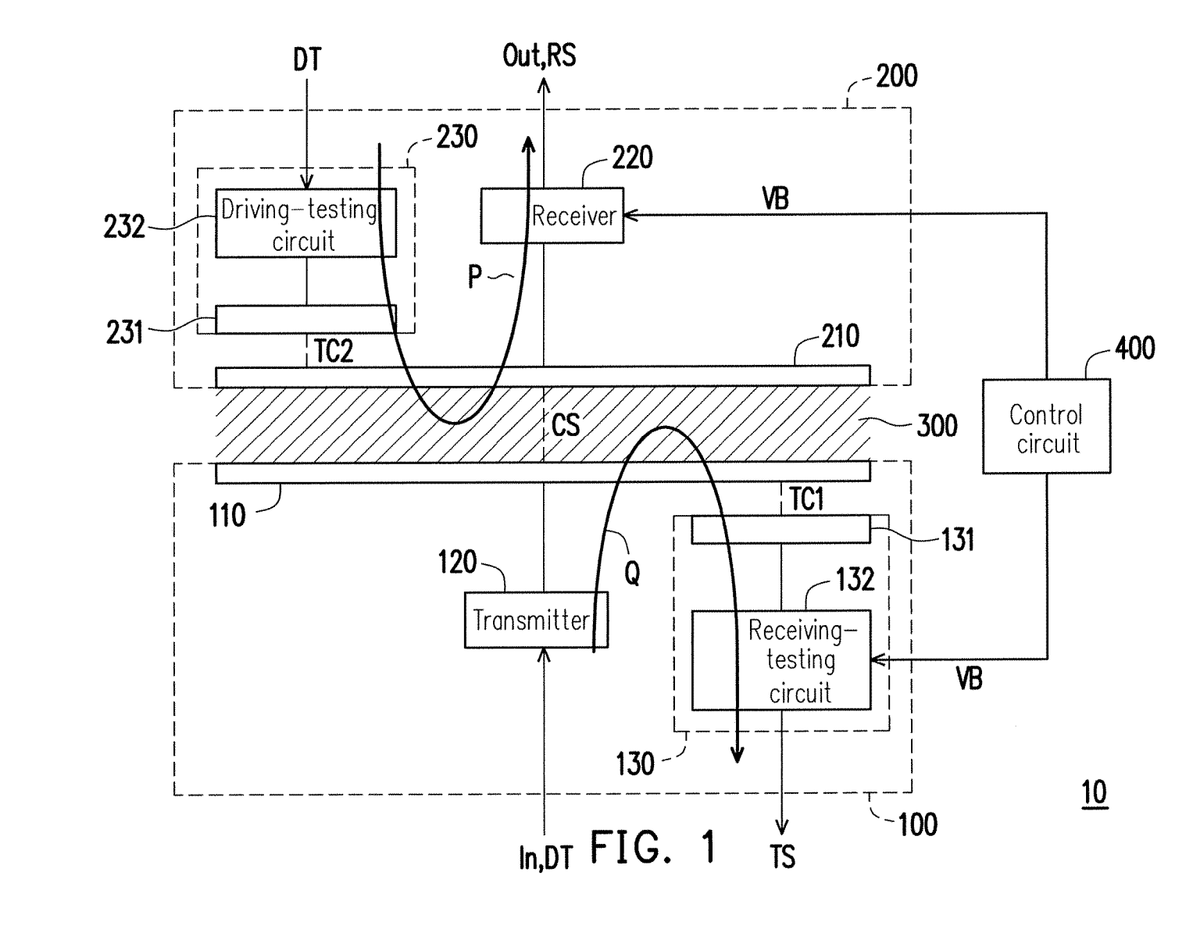
FIG. 1 is a schematic structural diagram of a chip-to-chip signal transmission system according to an embodiment of the present invention.

First, the present invention discloses a chip-to-chip signal transmission system that can perform self-testing. FIG. 1 is a schematic structural diagram of a chip-to-chip signal transmission system according to an embodiment of the present invention. Referring to FIG. 1, the chip-to-chip signal transmission system 10 includes a chip 100 and a chip 200, and a dielectric layer 300 is located between the chip 100 and the chip 200. The chip 100 includes a transmission-metal-pad 110, a transmitter 120, and a testing block 130. The transmission-metal-pad 110 is disposed on a surface of the chip 100. The transmitter 120 is coupled with the transmission-metal-pad 110, receives an input signal In, and outputs a chip-to-chip coupling signal CS through the transmission-metal-pad 110. The testing block 130 includes a transmission-testing-metal-pad 131 and a receiving-testing circuit 132, where the transmission-testing-metal-pad 131 is coupled with the transmission-metal-pad 110.

The chip 200 is disposed above the chip 100, and the chip 200 includes a reception-metal-pad 210, a receiver 220, and a testing block 230. The reception-metal-pad 210 is disposed, corresponding to the transmission-metal-pad 110, on a surface of the chip 200. The receiver 220 is coupled with the reception-metal-pad 210, receives the chip-to-chip coupling signal CS through the reception-metal-pad 210, and outputs an output signal Out. The testing block 230 includes a reception-testing-metal-pad 231 and a driving-testing circuit 232, where the reception-testing-metal-pad 231 is coupled with the reception-metal-pad 210. That is, the chip 100 is stacked with the chip 200 face to face, and the chip 100 and the chip 200 respectively use the transmission-metal-pad 110 and the reception-metal-pad 210 that are disposed on the surfaces of the chip 100 and the chip 200 as electrodes of a capacitor, to transmit a signal between the transmitter 120 and the receiver 220 through a capacitive coupling effect.

In other words, when the input signal In is inputted from the transmitter 120 end, the chip 100 uses the transmission-metal-pad 110 as an electrode of the capacitor, to transmit the input signal In from the chip 100 to the chip 200 in a capacitive coupling manner.

In addition, when receiving the driving-testing signal DT, the transmitter 120 transmits a transmission-testing-coupling signal TC1 through the transmission-metal-pad 110 according to a driving-testing signal DT. The receiving-testing circuit 132 receives the transmission-testing-coupling signal TC1 through the transmission-testing-metal-pad 131, and the receiving-testing circuit 132 outputs a transmission-testing signal TS according to the transmission-testing-coupling signal TC1.

That is, when a testing mode is enabled, the transmitter 120 receives the driving-testing signal DT, and transmits the transmission-testing-coupling signal TC1 through the transmission-metal-pad 110 according to the driving-testing signal DT. Because of the capacitive coupling effect generated between the transmission-metal-pad 110 and the transmission-testing-metal-pad 131, the receiving-testing circuit 132 may receive the transmission-testing-coupling signal TC1 from the transmission-testing-metal-pad 131, and output the transmission-testing signal TS according to the transmission-testing-coupling signal TC1. In other words, the transmitter 120 transmits back, through a transmission path Q after performing capacitive coupling, a signal received by the transmitter 120 to the receiving-testing circuit 132, and the transmission path Q is formed by the transmission-metal-pad 110 and the transmission-testing-metal-pad 131. In this manner, the testing block 130 may shift a output signal of the chip 100 to another place through wire bonding, and perform capacitive coupling signal transmission once again below the transmission-metal-pad 110, to transmit back the signal into the chip 100. Further, characteristics of the signal on which the capacitive coupling has been performed during actual transmission can be learnt through capturing and analysis of the transmission-testing signal TS by an external apparatus such as an oscilloscope. In this way, self-testing of a single chip may be implemented for the chip 100, and it may be determined according to the transmission-testing signal TS whether the chip can normally run.

On the other hand, the chip 200 uses the reception-metal-pad 210 as an electrode construction of the capacitor, and performs an internal circuit operation of the chip system 10 in a capacitive coupling manner. The chip 200 receives the chip-to-chip coupling signal CS from the chip 100. Further, when receiving the driving-testing signal DT, the driving-testing circuit 232 transmits a receiving-testing-coupling signal TC2 through the reception-testing-metal-pad 231 according to the driving-testing signal DT, the receiver 220 receives the receiving-testing-coupling signal TC2 through the reception-metal-pad 210, and the receiver 220 outputs a receiving-testing signal RS according to the receiving-testing-coupling signal TC2.

That is, when a testing mode is enabled, the driving-testing circuit 232 receives the driving-testing signal DT, and transmits the receiving-testing-coupling signal TC2 through the reception-testing-metal-pad 231. Because of a capacitive coupling effect generated between the reception-testing-metal-pad 231 and the reception-metal-pad 210, the receiver 220 may receive the receiving-testing-coupling signal TC2 from the reception-metal-pad 210, and then output the receiving-testing signal RS according to the receiving-testing-coupling signal TC2. For detail, the driving-testing circuit 232 transmits back, through a transmission path P after performing capacitive coupling, the signal received by the driving-testing circuit 232 to the receiver 220, and the transmission path P is formed by the reception-metal-pad 210 and the reception-testing-metal-pad 231. In his manner, the testing block 230 may generate a simulated signal of a transmission end in the chip 200, and transmit the signal into the chip 200 through the coupled capacitor. Further, characteristics of the signal on which the capacitive coupling has been performed during actual transmission can be learnt through capture and analysis of the receiving-testing signal RS by an external apparatus such as an oscilloscope. In this way, self-testing of a single chip may be implemented for the chip 200, and it may be determined according to the receiving-testing signal RS whether the chip can normally run.

It should be noted that to enable that a chip can still be adjusted slightly after the chip is physically made at the end of a production line, the receiver 220 and the receiving-testing circuit 132 in the present invention may receive a control voltage VB outputted by a control circuit 400 to properly adjust an signal to an ideal state, to select, according to a different state of each chip, an idealist conductive voltage value (VB) for the chip to improve sensitivity of the signal, so that a chip in a relatively poor process environment is adjusted to an available range. For example, the receiver 220 may receive a control voltage VB1 to properly adjust the output signal Out, or receive a control voltage VB2 to properly adjust the receiving-testing signal RS. The receiving-testing circuit 132 may receive a control voltage VB3 to properly adjust the transmission-testing signal TS. It should be noted that the control circuit 400 may receive an adjustment command CMD through a serial or parallel transmission interface. The control circuit 400 generates the control voltage VB according to the adjustment command CMD, and transmits the control voltage VB to the receiver 220 and the receiving-testing circuit 132, but an implementation manner of the control circuit 400 is not limited in the present invention.

In addition, to avoid external interference such as electromagnetic interference, signal interference, and noise during chip-to-chip capacitive coupling transmission of a signal by using metal pads, for designs of the transmitter 120 and the receiver 220, it needs to be considered that noise interference and weakening of the signal may be avoided during the capacitive coupling transmission by using the metal pads, to achieve an objective of signal transmission completeness.

Figure 2:
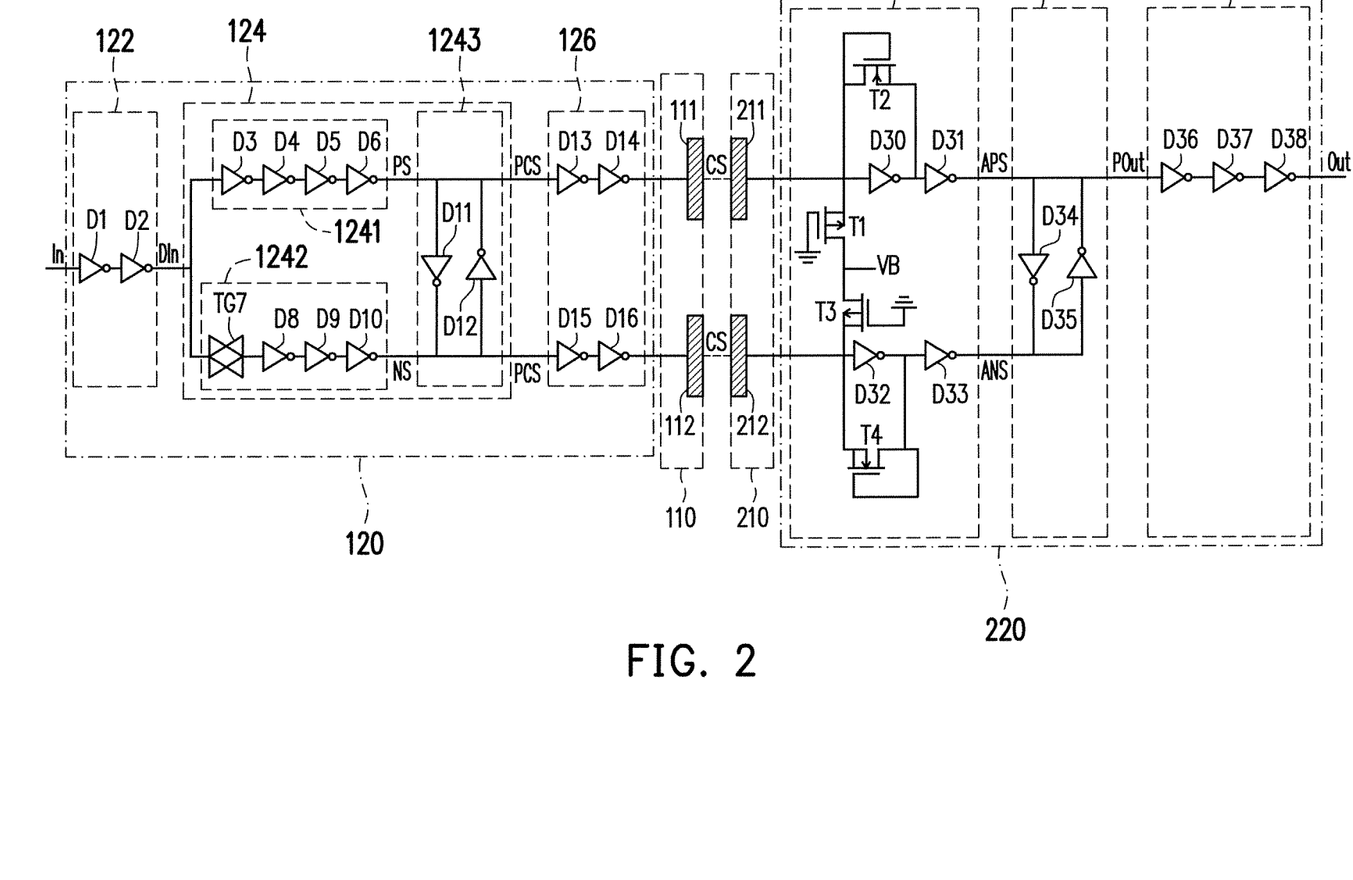
FIG. 2 is a circuit diagram of a transmitter and a receiver in a chip-to-chip signal transmission system according to an embodiment of the present invention.

Based on the foregoing, in the present invention, circuit designs of the transmitter 120 and the receiver 220 are designs using a differential double-pulse transmitting circuit and a differential double-pulse receiving circuit, so that a group of differential signals are transmitted between the chip 100 and the chip 200. FIG. 2 is a circuit diagram of a transmitter and a receiver in a chip-to-chip signal transmission system according to an embodiment of the present invention. The transmitter and the receiver may respectively correspond to a relatively detailed implementation manner of the transmitter 120 and the receiver 220 in the embodiment shown in FIG. 1.

Referring to FIG. 1 and FIG. 2 together, the transmission-metal-pad 110 includes a transmission-metal-pad 111 and a transmission-metal-pad 112, and the reception-metal-pad 210 includes a reception-metal-pad 211 and a reception-metal-pad 212 that are disposed respectively corresponding to the transmission-metal-pad 111 and the transmission-metal-pad 112 for transmitting a chip-to-chip coupling signal CS between the chip 100 and the chip 200. In the present embodiment, the chip-to-chip coupling signal CS is a group of differential signals.

The transmitter 120 includes a transmission buffer circuit 122, a differential signal generation circuit 124, and a transmission buffer circuit 126. The transmission buffer circuit 122 is used for: receiving an input signal In, and outputting a delayed input signal DIn. In the present embodiment, the transmission buffer circuit 122 includes a delay unit D1 and a delay unit D2.

The differential signal generation circuit 124 is coupled with the transmission buffer circuit 122. The differential signal generation circuit 124 is used for: receiving the delayed input signal DIn, and outputting a pre-output differential signal PCS. In the present embodiment, the differential signal generation circuit 124 includes a positive-signal generation unit 1241, a negative-signal generation unit 1242, and a latch unit 1243.

The positive-signal generation unit 1241 is used for: receiving the delayed input signal DIn, and outputting a positive signal PS. In the present embodiment, the positive-signal generation unit 1241 includes, for example, delay units D3 to D6. The positive signal PS is outputted from the delayed input signal DIn that is delayed by the delay units D3 to D6.

The negative-signal generation unit 1242 is used for: receiving the delayed input signal DIn, and outputting a negative signal NS. In the present embodiment, the negative-signal generation unit 1242 includes, for example, a transmission gate TG7, and delay units D8 to D10, or includes the delay units D7 to D10, and is used for generating a signal has a same amplitude and a reverse phase with the positive-signal generation unit 1241. That is, an amplitude of the negative signal NS is the same as that of the positive signal PS, but a phase of the negative signal NS is opposite to the positive signal PS.

The latch unit 1243 is coupled with the positive-signal generation unit 1241 and the negative-signal generation unit 1242, and is used for: latching the positive signal PS and the negative signal NS, and outputting the pre-output differential signal PCS. For example, the latch unit 1243 may include a delay unit D11 and a delay unit D12. An input end of the delay unit D11 is coupled with an output end of the delay unit D6, and an output end of the delay unit D11 is coupled with an output end of the delay unit D10. An input end of the delay unit D12 is coupled with the output end of the delay unit D10, and an output end of the delay unit D12 is coupled with the output end of the delay unit D6.

The transmission buffer circuit 126 is coupled with the differential signal generation circuit 124. In the present embodiment, the transmission buffer circuit 126 includes delay units D13 to D16. The transmission buffer circuit 126 is used for receiving the pre-output differential signal PCS. The transmission buffer circuit 126 may perform delay processing and load amplification on the pre-output differential signal PCS by using the delay units D13 to D16, and output the chip-to-chip coupling signal CS to the transmission-metal-pad 111 and the transmission-metal-pad 112, to transmit the chip-to-chip coupling signal CS through the transmission-metal-pad 111 and the transmission-metal-pad 112.

In the present embodiment, the foregoing delay units D1 to D16 are all reverse (reverse) delay units. For example, the reverse delay unit may include a delay component, such as a complementary metal-oxide-semiconductor inverter (Complementary Metal-Oxide-Semiconductor Inverter, CMOS Inverter) phase inverter, having reverse phase characteristics.

On the other hand, the receiver 220 includes an amplification circuit 222, a latch circuit 224, and a receiving buffer circuit 226. The amplification circuit 222 is coupled with the reception-metal-pad 211 and the reception-metal-pad 212, and receives the chip-to-chip coupling signal CS through the reception-metal-pad 211 and the reception-metal-pad 212. Because the chip-to-chip coupling signal CS may be already weakened when being received by the reception-metal-pad 211 and the reception-metal-pad 212 due to AC coupled transmission, an application of the amplification circuit 222 is to amplify the received chip-to-chip coupling signal CS.

The amplification circuit 222 is used for receiving the chip-to-chip coupling signal CS, and serves as a trans-impedance amplifier (Trans-impedance Amplifier) to generate an amplified-positive signal APS and an amplified-negative signal ANS. In the present embodiment, the amplification circuit 222 includes amplification units D30 to D33 and transistors (Transistor) T1 to T4. For example, the amplification units D30 to D33 may be implemented by an inverting amplifier (for example, CMOS Inverter), and the transistors T1 to T4 may be, for example, a metal-oxide-semiconductor field-effect transistor (Metal-Oxide-Semiconductor Field-Effect Transistor, MOSFET). The delay unit D30, the delay unit D31, the transistor T1, and the transistor T2 are used for: delaying and amplifying the chip-to-chip coupling signal CS received by the reception-metal-pad 211, and outputting the amplified-positive signal APS. The delay units D32 and D33 and the transistors T3 and T4 are used for: delaying and amplifying the chip-to-chip coupling signal CS received by the reception-metal-pad 212, and outputting the amplified-negative signal ANS.

It should be noted that the transistor T1 and the transistor T3 may serve as control bias points according to a control voltage VB outputted by the control circuit 400, to adjust amplification rates of the amplified-positive signal APS and the amplified-negative signal ANS, and the transistor T2 and the transistor T4 may serve as equivalent resistors. In other words, the present invention changes the equivalent resistors of the trans-impedance amplifier by changing conductive voltages of the transistor T1 and the transistor T3, and further adjusts sensitivity and a reply capability of the receiver 220 for a signal.

The latch circuit 224 is coupled with the amplification circuit 222, and is used for: latching the amplified-positive signal APS and the amplified-negative signal ANS, and converting the amplified-positive signal APS and the amplified-negative signal ANS into single phase for outputting, to output a pre-output signal POut. For example, the latch circuit 224 may include a delay unit D34 and a delay unit D35. An input end of the delay unit D34 is coupled with an output end of the delay unit D31, and an output end of the delay unit D34 is coupled with an output end of the delay unit D33. An input end of the delay unit D35 is coupled with the output end of the delay unit D33, and an output end of the delay unit D35 is coupled with the output end of the delay unit D31.

The receiving buffer circuit 226 is coupled with the latch circuit 224. The receiving buffer circuit 226 is used for: receiving the pre-output signal Pout, and outputting an output signal Out. In the present embodiment, the receiving buffer circuit 226 includes delay units D36 to D38, and the delay units D36 to D38 are all reverse delay units. The receiving buffer circuit 226 may output the output signal Out through the delay units D36 to D38 after performing load amplification on the pre-output signal Pout.

In this way, signal transmission between the chip 100 and the chip 200 may be implemented through the transmitter 120 and the receiver 220 in the present invention. In addition, to enable that the chip 100 and the chip 200 can both implement self-testing of a single chip, the present invention also discloses, according to the transmitter 120 and the receiver 220 in FIG. 2 a chip-to-chip signal transmission system that can perform self-testing.

Figure 3:
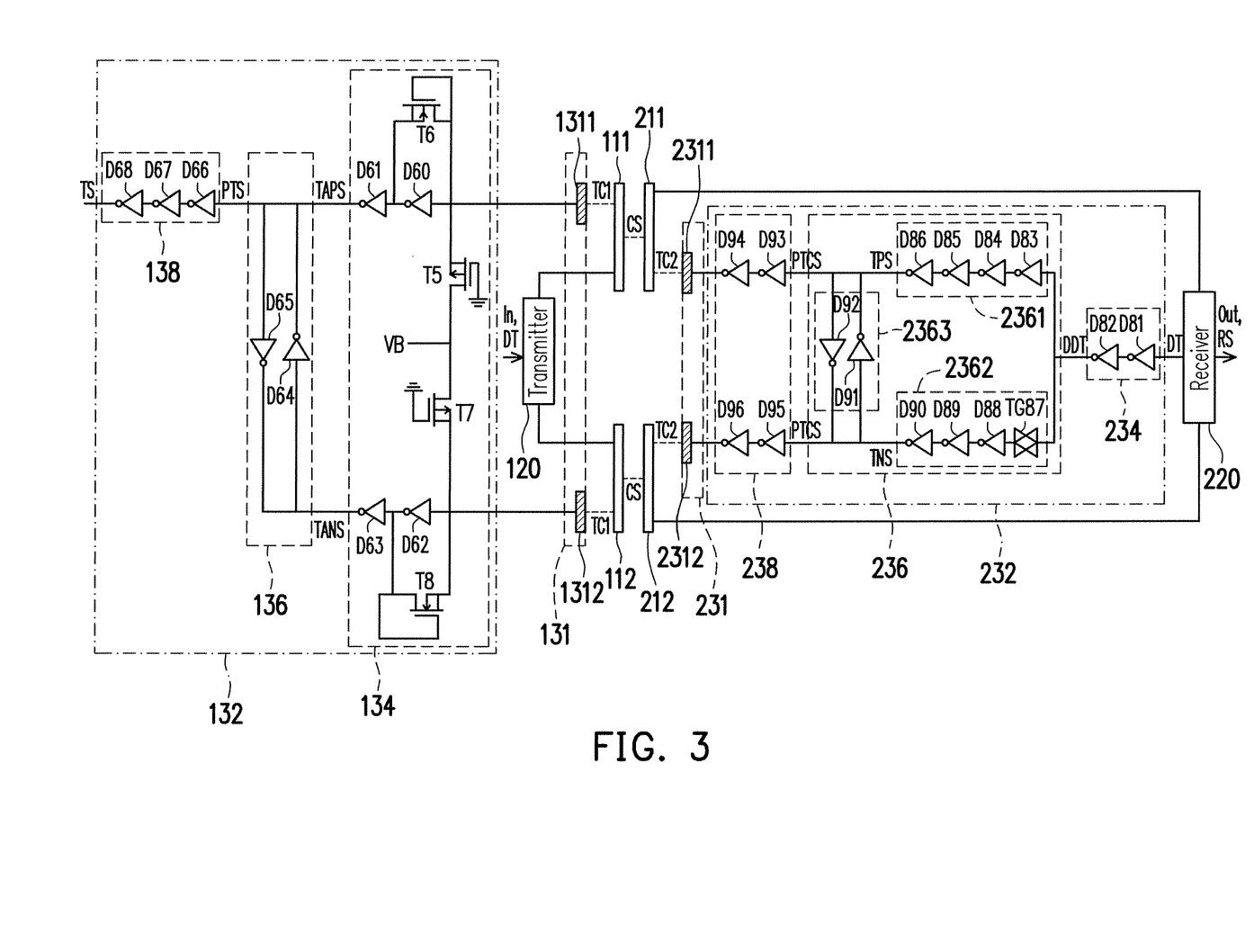
FIG. 3 is an architectural diagram of an overall circuit in a chip-to-chip signal transmission system according to an embodiment of the present invention.

Based on the foregoing, FIG. 3 is an architectural diagram of an overall circuit in a chip-to-chip signal transmission system according to an embodiment of the present invention, and may correspond to the embodiment shown in FIG. 1. Referring to FIG. 1 and FIG. 3 together, the transmission-testing-metal-pad 131 includes a transmission-testing-metal-pad 1311 and a transmission-testing-metal-pad 1312. When a testing mode is enabled, a transmission-testing-coupling signal TC1 received by the transmission-testing-metal-pad 1311 and the transmission-testing-metal-pad 13121 is also a group of differential signals.

The receiving-testing circuit 132 includes an amplification circuit 134, a latch circuit 136, and a receiving buffer circuit 138. The amplification circuit 134 is coupled with the transmission-testing-metal-pad 1311 and the transmission-testing-metal-pad 1312, and receives the transmission-testing-coupling signal TC1 through the transmission-testing-metal-pad 1311 and the transmission-testing-metal-pad 1312. Because the transmission-testing-coupling signal TC1 may be weakened when being received by the transmission-testing-metal-pad 1311 and the transmission-testing-metal-pad 1312 due to AC coupled transmission, the amplification circuit 134 included by the receiving-testing circuit 132 amplifies the received transmission-testing-coupling signal TC1. It is noteworthy that a coupling effect of signal transmission based on self-testing in the chip 100 is better than that of transmitting a signal to the receiver 220.

The amplification circuit 134 is used for receiving the transmission-testing-coupling signal TC1, and also serves as a trans-impedance amplifier to generate a testing amplified-positive signal TAPS and a testing amplified-negative signal TANS. In the present embodiment, the amplification circuit 134 includes amplification units D60 to D63 and transistors T5 to T8. For example, the amplification units D60 to D63 may be implemented by an inverting amplifier (for example, CMOS Inverter), and the transistors T5 to T8 may be, for example, a metal-oxide-semiconductor field-effect transistor. The delay unit D60, the delay unit D61, the transistor T5, and the transistor T6 are used for: delaying and amplifying the transmission-testing-coupling signal TC1 received by the transmission-testing-metal-pad 1311, and outputting the testing amplified-positive signal TAPS. The delay unit D62, the delay unit D63, the transistor T7, and the transistor T8 are used for: delaying and amplifying the transmission-testing-coupling signal TC1 received by the transmission-testing-metal-pad 1312, and outputting the testing amplified-negative signal TANS.

Similarly, the transistor T5 and the transistor T7 may also serve as control bias points according to a control voltage VB outputted by the control circuit 400, to adjust amplification rates of the testing amplified-positive signal TAPS and the testing amplified-negative signal TANS, and the transistor T6 and the transistor T8 may be used as equivalent resistors. That is, the present invention changes the equivalent resistors of the trans-impedance amplifier by changing conductive voltages of the transistor T5 and the transistor T7, and further adjusts sensitivity and a reply capability of the receiving-testing circuit 132 for a signal.

The latch circuit 136 is coupled with the amplification circuit 134, and is used for: latching the testing amplified-positive signal TAPS and the testing amplified-negative signal TANS, and converting the testing amplified-positive signal TAPS and the testing amplified-negative signal TANS into single phase for outputting, to output a pre-output testing signal PTS. For example, the latch circuit 136 may include a delay unit D64 and a delay unit D65. An input end of the delay unit D64 is coupled with an output end of the delay unit D63, and an output end of the delay unit D64 is coupled with an output end of the delay unit D61. An input end of the delay unit D65 is coupled with the output end of the delay unit D61, and an output end of the delay unit D65 is coupled with the output end of the delay unit D63.

The receiving buffer circuit 138 is coupled with the latch circuit 136. The receiving buffer circuit 138 is used for: receiving the pre-output testing signal PTS, and outputting a transmission-testing signal TS. In the present embodiment, the receiving buffer circuit 138 includes delay units D66 to D68, and the delay units D66 to D68 are all reverse delay units. The receiving buffer circuit 138 may output the transmission-testing signal TS through the delay units D66 to D68 after performing load amplification on the pre-output testing signal PTS.

It can be learnt from the foregoing description that in the present embodiment, the receiving-testing circuit 132 has a similar circuit structure with the receiver 220, both the receiving-testing circuit 132 and the receiver 220 not only receive a signal outputted by the transmitter 120, but also receive the signal through a capacitive coupling effect. For detail, the transmitter 120 outputs the chip-to-chip coupling signal CS through the transmission-metal-pad 111 and the transmission-metal-pad 112, and the receiver 220 receives the chip-to-chip coupling signal CS through the reception-metal-pad 211 and the reception-metal-pad 212. When a testing mode is enabled, the transmitter 120 outputs the transmission-testing-coupling signal TC1 through the transmission-metal-pad 111 and the transmission-metal-pad 112, and the receiving-testing circuit 132 receives the transmission-testing-coupling signal TC1 through the transmission-testing-metal-pad 1311 and the transmission-testing-metal-pad 1312.

On the other hand, the reception-testing-metal-pad 231 includes a reception-testing-metal-pad 2311 and a reception-testing-metal-pad 2312. When receiving the driving-testing signal DT, the driving-testing circuit 232 generates a receiving-testing-coupling signal TC2 according to the driving-testing signal DT, and transmits the receiving-testing-coupling signal TC2 through the reception-testing-metal-pad 2311 and the reception-testing-metal-pad 2312, where the receiving-testing-coupling signal TC2 is also a group of differential signals.

In the present embodiment, the driving-testing circuit 232 includes a transmission buffer circuit 234, a differential signal generation circuit 236, and a transmission buffer circuit 238.

The transmission buffer circuit 234 is used for: receiving the driving-testing signal DT, and outputting a delayed testing signal DDT. In the present embodiment, the transmission buffer circuit 234 includes a delay unit D81 and a delay unit D82.

The differential signal generation circuit 236 is coupled with the transmission buffer circuit 234. The differential signal generation circuit 236 is used for: receiving the delayed testing signal DDT, and outputting a pre-output receiving-testing differential signal PTCS. In the present embodiment, the differential signal generation circuit 236 includes a positive-signal generation unit 2361, a negative-signal generation unit 2362, and a latch unit 2363.

The positive-signal generation unit 2361 is used for: receiving the delayed testing signal DDT, and outputting a testing positive signal TPS. In the present embodiment, the positive-signal generation unit 2361 includes, for example, delay units D83 to D86. The testing positive signal TPS is outputted from the delayed testing signal DDT which is delayed by the delay units D83 to D86.

The negative-signal generation unit 2362 is used for: receiving the delayed testing signal DDT, and outputting a testing negative signal TNS. In the present embodiment, the negative-signal generation unit 2362 includes, for example, a transmission gate TG87, and delay units D88 to D90, or includes the delay units D87 to D90, and is used for generating a signal has a same amplitude and a reverse phase with the positive-signal generation unit 2361. That is, an amplitude of the testing negative signal TNS is the same as that of the testing positive signal TPS, but a phase of the testing negative signal TNS is opposite to the testing positive signal TPS.

The latch unit 2363 is coupled with the positive-signal generation unit 2361 and the negative-signal generation unit 2362, and is used for: latching the testing positive signal TPS and the testing negative signal TNS, and outputting a pre-output receiving-testing differential signal PTCS, according to the testing positive signal TPS and the testing negative signal TNS. For example, the latch unit 2363 may include a delay unit D91 and a delay unit D92. An input end of the delay unit D91 is coupled with an output end of the delay unit D90, and an output end of the delay unit D91 is coupled with an output end of the delay unit D86. An input end of the delay unit D92 is coupled with the output end of the delay unit D86, and an output end of the delay unit D92 is coupled with the output end of the delay unit D90.

The transmission buffer circuit 238 is coupled with the differential signal generation circuit 236. In the present embodiment, the transmission buffer circuit 238 includes delay units D93 to D96. The transmission buffer circuit 238 is used for the pre-output receiving-testing differential signal PTCS. The transmission buffer circuit 126 may perform delay processing and load amplification on the pre-output receiving-testing differential signal PTCS by using the delay units D93 to D96, and output the receiving-testing-coupling signal TC2 to the reception-testing-metal-pad 2311 and the reception-testing-metal-pad 2312, to transmit the receiving-testing-coupling signal TC2 through the reception-testing-metal-pad 2311 and the reception-testing-metal-pad 2312.

In the present embodiment, the foregoing delay units D81 to D96 are all reverse delay units. For example, the reverse delay unit may include a delay component, such as a complementary metal-oxide-semiconductor inverter phase inverter, having reverse phase characteristics.

It can be learnt from the foregoing description that in the present embodiment, the driving-testing circuit 232 has a similar circuit structure with the transmitter 120, and both of the two transmit a signal to the receiver 220 through a capacitive coupling effect. For detail, the transmitter 120 outputs the chip-to-chip coupling signal CS through the transmission-metal-pad 111 and the transmission-metal-pad 112, and the receiver 220 receives the chip-to-chip coupling signal CS through the reception-metal-pad 211 and the reception-metal-pad 212. When the testing mode is enabled, the driving-testing circuit 232 outputs the receiving-testing-coupling signal TC2 through the reception-testing-metalpad 2311 and the reception-testing-metal-pad 2312, and the receiver 220 receives the receiving-testing-coupling signal TC2 through the reception-metal-pad 211 and the reception-metal-pad 212.

In short, the testing-metal-pad 1311 and the testing-metal-pad 1312 are disposed in the chip 100, so that the testing-metal-pad 1311, the testing-metal-pad 1312, the transmission-metal-pad 111, and the transmission-metal-pad 112 can transmit a signal in the chip 100 in a capacitive coupling manner. Similarly, the reception-testing-metal-pad 2311 and the reception-testing-metal-pad 2312 are disposed in the chip 200, so that the reception-testing-metal-pad 2311, the reception-testing-metal-pad 2312, the reception-metal-pad 211, and the reception-metal-pad 212 can transmit a signal in the chip 200 in a capacitive coupling manner. In this way, chips at a transmitting end and a receiving end can both perform self-testing of a single chip to test whether the chip can normally runs, so that the chips at the transmitting end and the receiving end can effectively figure out through self-testing that a problem is caused due to defects of the chips at the transmitting end and the receiving end or defects of a capacitive coupling effect when a poor condition occurs.

Based on the foregoing, the present invention provides a chip-to-chip signal transmission system and signal receiving circuit. By means of chip-to-chip signal transmission system, a receiving-testing circuit and a driving-testing circuit that are simple and same are disposed in paired transmitter and receiver, so that when signal transmission between chips fails, possible defective factors can be selected through self-testing of the chips. In addition, by means of the chip-to-chip signal transmission system of the present invention, a chip in a relatively poor process environment may be adjusted to an available range by adjusting a conductive voltage of an amplification circuit at a receiving end, thereby further reducing a failure rate of the chip effectively.

Although the present invention is already disclosed in the foregoing embodiments, the foregoing embodiments are not intended to limit the present invention. Any person of ordinary skills in the art can make some variations and modifications without departing from the scope or spirit of the invention. Therefore, the protection scope of the present invention is subject to the scope of the accompanying claims.

What is claimed is:

1. A chip-to-chip signal transmission system, comprising:
a first chip, comprising:
a transmission-metal-pad, disposed on a surface of the first chip;
a transmitter, coupled with the transmission-metal-pad, receiving an input signal and outputting a chip-to-chip coupling signal through the transmission-metal-pad; and
a first testing block, comprising a transmission-testing-metal-pad and a receiving-testing circuit, wherein the transmission-testing-metal-pad is coupled with the transmission-metal-pad; and
a second chip, disposed above the first chip, comprising:
a reception-metal-pad, disposed on a surface of the second chip, corresponding to the transmission-metal-pad;
a receiver, coupled with the reception-metal-pad, receiving the chip-to-chip coupling signal through the reception-metal-pad and outputting an output signal, wherein the receiver receives a first control voltage outputted by a control circuit to adjust the output signal; and
a second testing block, comprising a reception-testing-metal-pad and a driving-testing circuit, wherein the reception-testing-metal-pad is coupled with the reception-metal-pad, wherein when receiving a driving-testing signal, the transmitter transmits a transmission-testing-coupling signal through the transmission-metal-pad according to the driving-testing signal, the receiving-testing circuit receives the transmission-testing-coupling signal through the transmission-testing-metal-pad, and the receiving-testing circuit outputs a transmission-testing signal according to the transmission-testing-coupling signal, wherein the receiving-testing circuit receives a second control voltage outputted by the control circuit to adjust the transmission-testing signal; and when receiving the driving-testing signal, the driving-testing circuit transmits a receiving-testing-coupling signal through the reception-testing-metal-pad according to the driving-testing signal, the receiver receives the receiving-testing-coupling signal through the reception-metal-pad, and the receiver outputs a receiving-testing signal according to the receiving-testing-coupling signal, wherein the receiver receives a third control voltage outputted by the control circuit to adjust the receiving-testing signal.

2. The chip-to-chip signal transmission system according to claim 1, wherein the transmission-metal-pad comprises a first transmission-metal-pad and a second transmission-metal-pad, and the chip-to-chip coupling signal is a differential signal, and the transmitter comprises:
a first transmission buffer circuit, receiving the input signal and outputting a delayed input signal;
a differential signal generation circuit, coupled with the first transmission buffer circuit, wherein the differential signal generation circuit is configured to receive the delayed input signal and output a pre-output differential signal; and
a second transmission buffer circuit, coupled with the differential signal generation circuit, wherein the second transmission buffer circuit is configured to receive the pre-output differential signal, and output the differential signal to the first transmission-metal-pad and the second transmission-metal-pad, to transmit the differential signal through the first transmission-metal-pad and the second transmission-metal-pad.

3. The chip-to-chip signal transmission system according to claim 2, wherein the reception-metal-pad comprises a first reception-metal-pad and a second reception-metal-pad, and the receiver comprises:
an amplification circuit, coupled with the first reception-metal-pad and the second reception-metal-pad, receiving the differential signal through the first reception-metal-pad and the second reception-metal-pad, and generating a differential amplified signal, wherein the amplification circuit receives a first control bias to adjust an amplification rate of the differential amplified signal;
a latch circuit, coupled with the amplification circuit, receiving the differential amplified signal and outputting a pre-output signal; and
a receiving buffer circuit, coupled with the latch circuit, receiving the pre-output signal and outputting the output signal.

4. The chip-to-chip signal transmission system according to claim 1, wherein the transmission-testing-metal-pad comprises a first transmission-testing-metal-pad and a second transmission-testing-metal-pad, and the transmission-testing-coupling signal is a transmission-testing differential signal, and the receiving-testing circuit comprises:
- an amplification circuit, coupled with the first transmission-testing-metal-pad and the second transmission-testing-metal-pad, receiving the transmission-testing differential signal through the first transmission-testing-metal-pad and the second transmission-testing-metal-pad, and generating a transmission-testing differential amplified signal, wherein the amplification circuit receives the second control voltage to adjust an amplification rate of the transmission-testing differential amplified signal;
- a latch circuit, coupled with the amplification circuit, receiving the transmission-testing differential amplified signal and outputting a pre-transmission-testing signal; and
- a receiving buffer circuit, coupled with the latch circuit, receiving the pre-transmission-testing signal and outputting the transmission-testing signal.

5. The chip-to-chip signal transmission system according to claim 1, wherein the reception-testing-metal-pad comprises a first reception-testing-metal-pad and a second reception-testing-metal-pad, and the receiving-testing-coupling signal is a receiving-testing differential signal, and the driving-testing circuit comprises:
- a first transmission buffer circuit, receiving the driving-testing signal and outputting a delayed input-testing signal;
- a differential signal generation circuit, coupled with the first transmission buffer circuit, wherein the differential signal generation circuit is configured to receive the delayed input-testing signal and output a pre-output receiving-testing differential signal; and
- a second transmission buffer circuit, coupled with the differential signal generation circuit, wherein the second transmission buffer circuit is configured to receive the pre-output receiving-testing differential signal and output the receiving-testing differential signal to the first reception-testing-metal-pad and the second reception-testing-metal-pad, to transmit the receiving-testing differential signal through the first reception-testing-metal-pad and the second reception-testing-metal-pad.

6. A signal reception circuit, applied to be disposed on a chip, comprising:
- a reception-metal-pad, disposed on a surface of the chip;
- a receiver, coupled with the reception-metal-pad, receiving an input signal through the reception-metal-pad and outputting a recovery signal, wherein the receiver comprises:
  - an amplification circuit, receiving the input signal and generating an amplified input signal, wherein the amplification circuit adjusts an amplification rate of the amplified input signal by receiving a first control voltage outputted by a control circuit;
  - a latch circuit, coupled with the amplification circuit, latching the amplified input signal and outputting a pre-recovery signal; and
  - a receiving buffer circuit, coupled with the latch circuit, receiving the pre-recovery signal and outputting the recovery signal; and
- a second testing block, comprising a reception-testing-metal-pad and a driving-testing circuit, wherein the reception-testing-metal-pad is coupled with the reception-metal-pad, wherein when receiving a driving-testing signal, the driving-testing circuit transmits a receiving-testing-coupling signal through the reception-testing-metal-pad according to the driving-testing signal, the receiver receives the receiving-testing-coupling signal through the reception-metal-pad, and the receiver outputs a receiving-testing signal according to the receiving-testing-coupling signal, wherein the receiver receives a second control voltage outputted by the control circuit to adjust the receiving-testing signal.

* * * * *